United States Patent
Lin et al.

(10) Patent No.: US 7,659,964 B2
(45) Date of Patent: Feb. 9, 2010

(54) LEVEL ADJUSTMENT SYSTEMS AND ADJUSTABLE PIN CHUCK THEREOF

(75) Inventors: Burn-Jeng Lin, Hsinchu (TW);
Tsai-Sheng Gau, Hsinchu (TW);
Jeng-Horng Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 337 days.

(21) Appl. No.: 11/390,944

(22) Filed: Mar. 28, 2006

(65) Prior Publication Data
US 2007/0236857 A1 Oct. 11, 2007

(51) Int. Cl.
*G03B 27/58* (2006.01)
(52) U.S. Cl. .......................... 355/72; 355/53
(58) Field of Classification Search .............. 355/72, 355/53, 30; 361/234
See application file for complete search history.

(56) References Cited

U.S. PATENT DOCUMENTS

| | | | | |
|---|---|---|---|---|
| 4,391,511 A * | 7/1983 | Akiyama et al. | ............... | 355/40 |
| 5,184,176 A * | 2/1993 | Unno et al. | ................ | 355/52 |
| 6,710,857 B2 * | 3/2004 | Kondo | ............ | 355/72 |
| 6,805,338 B1 * | 10/2004 | Okuda | ............ | 269/21 |
| 6,813,000 B1 * | 11/2004 | Nishi | ............ | 355/53 |
| 6,875,987 B2 * | 4/2005 | Kondo | ............ | 250/442.11 |
| 2005/0018167 A1 * | 1/2005 | Hennus et al. | ............ | 355/72 |

\* cited by examiner

*Primary Examiner*—Edward J Glick
*Assistant Examiner*—Mesfin T Asfaw
(74) *Attorney, Agent, or Firm*—Thomas, Kayden, Horstemeyer & Risley

(57) ABSTRACT

A level adjustment system. The level adjustment system includes an adjustable pin chuck, an evacuation device, a level detection device and a length control device. The adjustable pin chuck includes a base and a variable pin to support a substrate. The base includes a recess and an evacuation channel connected thereto. The variable pin is disposed in the recess. The evacuation device is connected to the evacuation channel to evacuate the recess, such that the substrate is attached to the base and variable pin. The level detection device is disposed on the adjustable pin chuck to detect the horizontality of a target surface of the substrate. The length control device is electrically connected to the level detection device and variable pin. The length control device changes the length of the variable pin to adjust level of the target surface of the substrate according to the detected horizontality.

14 Claims, 8 Drawing Sheets

LEVEL ADJUSTMENT SYSTEMS AND ADJUSTABLE PIN CHUCK THEREOF

BACKGROUND

The present invention relates to level adjustment systems, and in particular to level adjustment systems that level substrates.

In semiconductor manufacturing, a wafer is usually supported by a pin chuck to enable, for example, exposure of photolithography.

Referring to FIG. 1, a conventional pin chuck 1 comprises a base 11, an evacuation channel 12, a plurality of hollow pins 13 and two interferometer mirrors 14. The hollow pins 13 are uniformly formed on the base 11. The evacuation channel 12 is formed in the base 11 and is connected to the hollow interior of each hollow pin 13. The interferometer mirrors 14 are respectively disposed on two sides of the base 11 to position a wafer W.

As shown in FIG. 1, when the wafer W is placed on the base 11 and hollow pins 13, a vacuum pump 15 evacuates the evacuation channel 12. The bottom surface of the wafer W is thus securely attached to the base 11 and hollow pins 13. Exposure can then be performed on the top surface of the wafer W.

Referring to FIG. 2, another conventional pin chuck 2 comprises a base 21, an evacuation channel 22, a plurality of solid pins 23 and two interferometer mirrors 24. The solid pins 23 are uniformly formed on the base 21. The evacuation channel 22 is formed in the base 21 and under the solid pins 23. The interferometer mirrors 24 are respectively disposed on two sides of the base 21 to position a wafer W.

As shown in FIG. 2, when the wafer W is placed on the base 21 and solid pins 23, a vacuum pump 25 evacuates the evacuation channel 22. The bottom surface of the wafer W is thus securely attached to the base 21 and solid pins 23. Exposure can also be performed on the top surface of the wafer W.

The pin chucks 1 and 2, however, encounter a problem during processing of the wafer W. Although the wafer W can be securely attached to the pin chucks 1 and 2, the surface of the wafer W is usually uneven, whereby exposure is adversely affected or cannot be applied thereto.

For example, as shown in FIG. 3, a step-and-repeat or step-and-scan projection printing device 3 is above the pin chuck 1 and comprises a light source and illuminator 31, a mask 32 and an imaging lens 33. When the step-and-repeat or step-and-scan projection printing device 3 performs exposure on a photoresist layer 4 disposed on the top surface of the wafer W, the pin chuck 1 (or the pin chuck 1 and step-and-repeat or step-and-scan projection printing device 3) moves transversely. A distance D between the imaging lens 33 of the step-and-repeat or step-and-scan projection printing device 3 and the photoresist layer 4 on the wafer W, however, is usually short, such as between 1 and 10 mm. The change of D due to an uneven chucked wafer surface may cause the photoresist layer to be out of focus of the imaging lens 33.

SUMMARY

An exemplary embodiment provides a level adjustment system comprising an adjustable pin chuck, an evacuation device, a level detection device and a length control device. The adjustable pin chuck comprises a base and at least one variable pin to support a substrate. The base comprises a recess and an evacuation channel connected thereto. The variable pin is disposed in the recess. The evacuation device is connected to the evacuation channel of the base to evacuate the recess, such that the substrate is attached to the base and variable pin. The level detection device is disposed on the adjustable pin chuck to detect the horizontality of a target surface of the substrate. The length control device is electrically connected to the level detection device and variable pin. The length control device changes the length of the variable pin to level the target surface of the substrate according to the horizontality detected by the level detection device.

The level detection device further comprises a light source module, a beam splitter, an optical-flat glass and a receiver. The light source module is disposed on the beam splitter. The beam splitter is disposed on the optical-flat glass. The optical-flat glass is disposed on the substrate. The receiver is disposed on one side of the beam splitter and is electrically connected to the length control device.

The optical-flat glass further comprises a semi-reflective surface substantially parallel to the target surface of the substrate.

The receiver comprises a CCD sensor.

Another level detection device comprises an air gauge, or a capacitance gauge.

The air gauge further comprises at least one air-output pipe and at least one pressure sensor. The air-output pipe is separated from the target surface of the substrate. The pressure sensor is disposed on the air-output pipe and is electrically connected to the length control device.

The capacitance gauge further comprises at least one metal plate substantially parallel to the target surface of the substrate.

Yet another level detection device comprises a light source module and a light receiver connected thereto with at predetermined distance. The light receiver is electrically connected to the length control device. The light source module and light receiver move above and relative to the target surface of the substrate. The light source module outputs a light beam to the target surface of the substrate at a predetermined included angle. The light beam is reflected by the target surface and is received by the light receiver.

The variable pin comprises a piezoelectric material.

The variable pin further comprises a piezoelectric element and a supporting element. The piezoelectric element is disposed on the base and is electrically connected to the length control device. The supporting element is disposed on the piezoelectric element to support the substrate.

The supporting element further comprises an L-type through hole connected to the recess.

The variable pin further comprises a hollow column and a piezoelectric element. The hollow column is connected to the evacuation channel and supports the substrate. The outer wall of the hollow column is formed with an annular groove. The piezoelectric element is disposed in the annular groove and is electrically connected to the length control device.

Another exemplary embodiment provides an adjustable pin chuck comprising a base and at least one variable pin. The base comprises a recess and an evacuation channel connected thereto. The variable pin is disposed in the recess. The base and variable pin support a substrate. The recess is evacuated via the evacuation channel to attach the substrate to the base and variable pin. The variable pin lengthens and shortens to level the substrate.

The variable pin comprises a piezoelectric material.

The variable pin further comprises a piezoelectric element and a supporting element. The piezoelectric element is disposed on the base. The supporting element is disposed on the piezoelectric element to support the substrate.

The supporting element further comprises an L-type through hole connected to the recess.

The variable pin further comprises a hollow column and a piezoelectric element. The hollow column is connected to the evacuation channel and supports the substrate. The outer wall of the hollow column is formed with an annular groove to receive the piezoelectric element.

BRIEF DESCRIPTION OF THE DRAWINGS

The present invention can be more fully understood by reading the subsequent detailed description and examples with references made to the accompanying drawings, wherein.

DETAILED DESCRIPTION

First Embodiment

Figure 1:
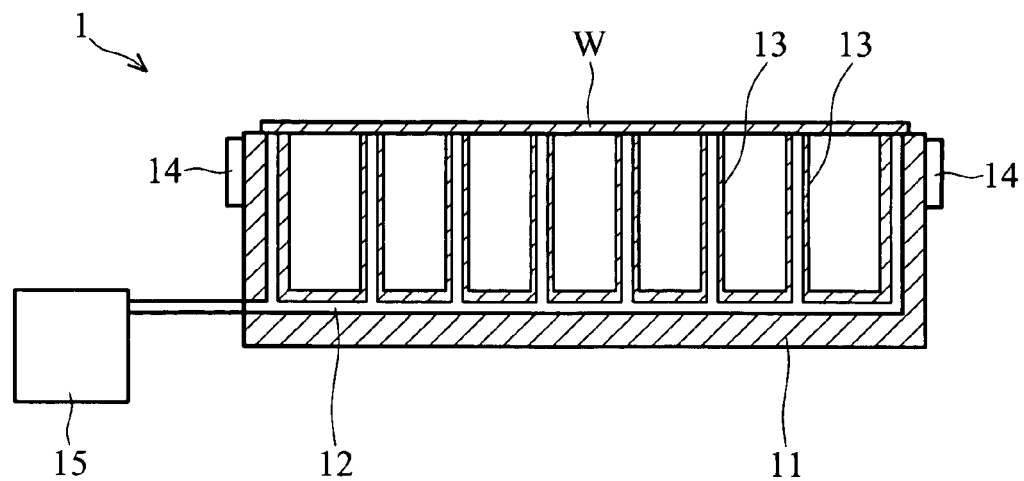
FIG. 1 is a schematic cross section of a conventional pin chuck.
Figure 2:
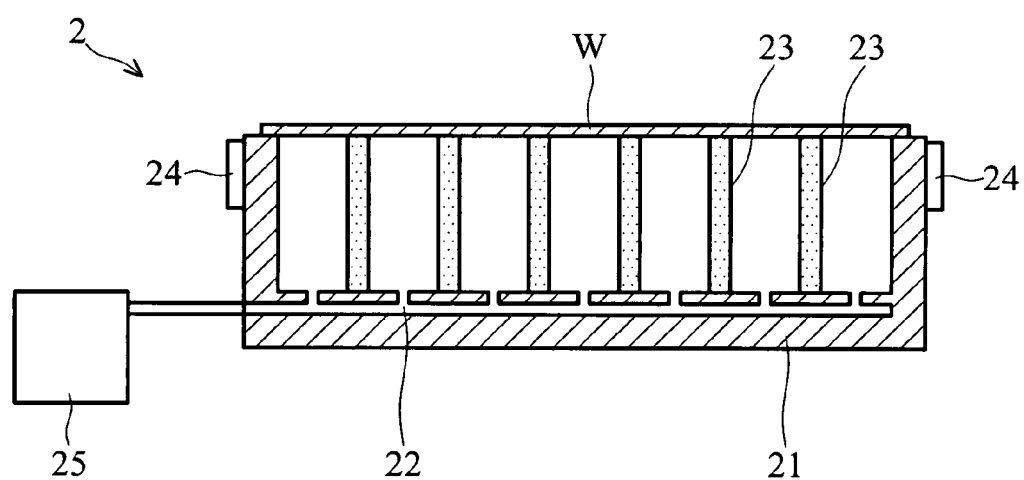
FIG. 2 is a schematic cross section of another conventional pin chuck.
Figure 3:
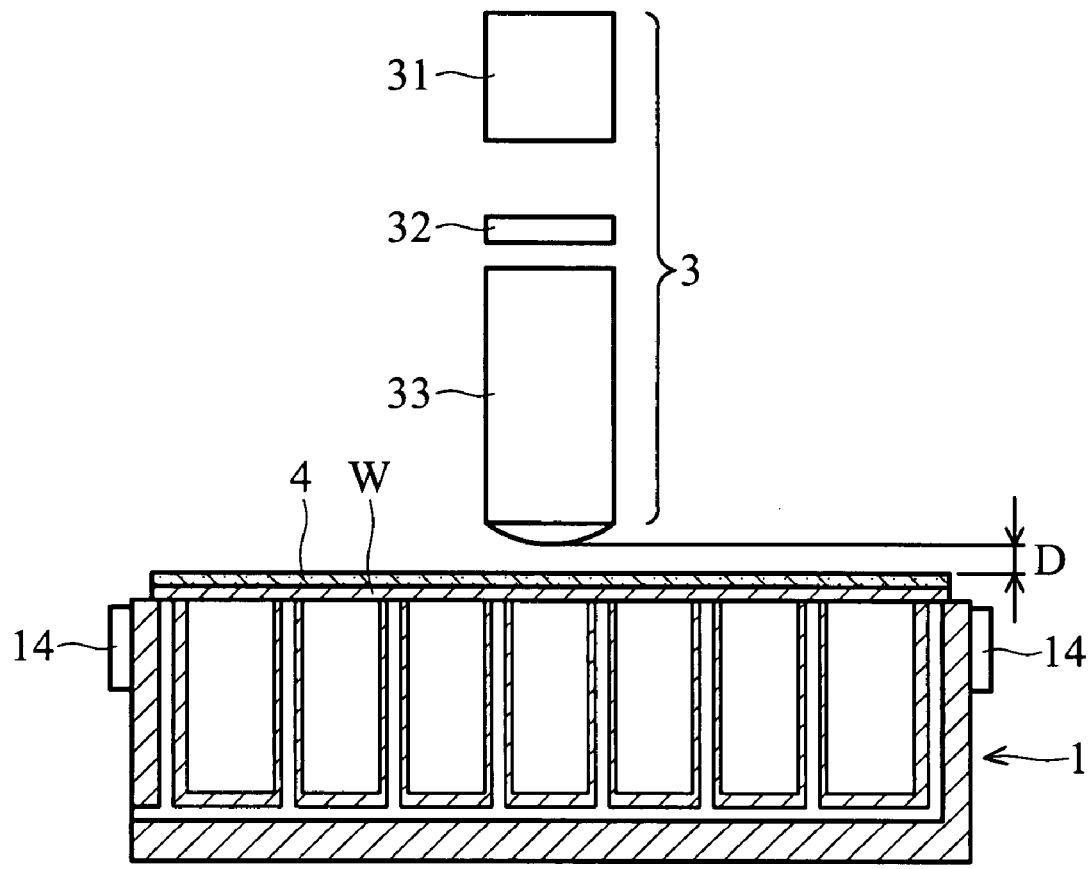
FIG. 3 shows application of the pin chuck of FIG. 1.
Figure 4:
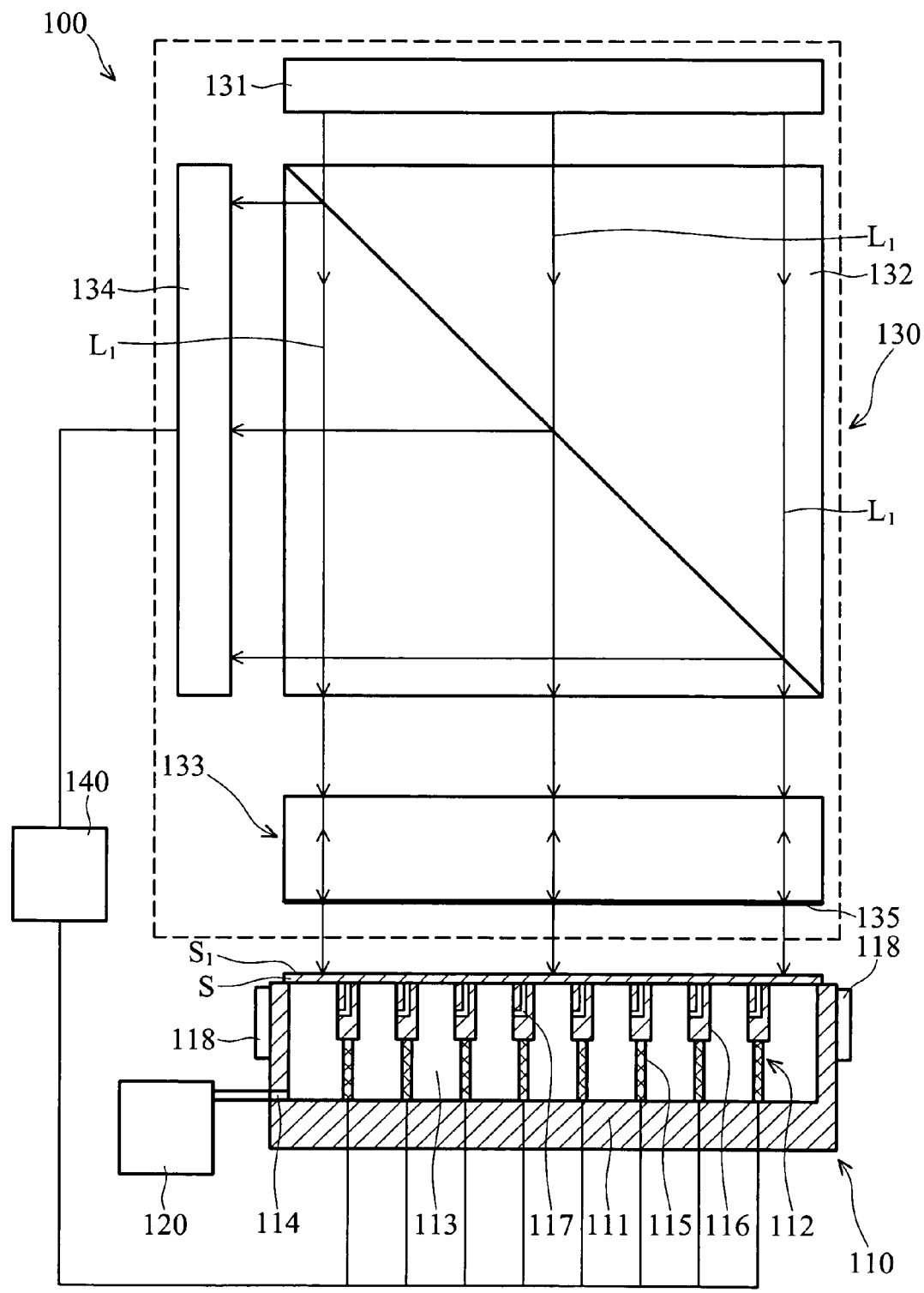
FIG. 4 is a schematic view of the level adjustment system of a first embodiment of the invention.

Referring to FIG. 4, the level adjustment system 100 of this embodiment comprises an adjustable pin chuck 110, an evacuation device 120, a level detection device 130 and a length control device 140.

As shown in FIG. 4, the adjustable pin chuck 110 comprises a base 111 and a plurality of variable pins 112. The base 111 comprises a recess 113 and an evacuation channel 114 connected thereto. The variable pins 112 are uniformly disposed in the recess 113. In this embodiment, each variable pin 112 comprises a piezoelectric element 115 and a supporting element 116. The piezoelectric element 115 is disposed on the base 111 and the supporting element 116 is disposed on the piezoelectric element 115. Additionally, the supporting element 116 comprises an L-type through hole 117 connected to the recess 113 of the base 111.

The evacuation device 120 is connected to the evacuation channel 114 of the base 111.

The level detection device 130 is disposed on the adjustable pin chuck 110 and comprises a light source module 131, a beam splitter 132, an optical-flat glass 133 and a receiver 134. The light source module 131 is disposed on the beam splitter 132. The beam splitter 132 is disposed on the optical-flat glass 133. The receiver 134 is disposed on one side of the beam splitter 132. Additionally, the optical-flat glass 133 comprises a semi-reflective surface 135. The semi-reflective surface 135 is flat and can thereby serve as a reference surface. The receiver 134 may be a CCD sensor.

The length control device 140 is electrically connected to the level detection device 130 and the variable pins 112. Specifically, the length control device 140 is electrically connected to the receiver 134 of the level detection device 130 and piezoelectric element 115 of each variable pin 112.

Additionally, two interferometer mirrors 118 are disposed on two sides of the base 111 of the adjustable pin chuck 110, respectively.

The following description is directed to adjustment of level of a substrate S using the level adjustment system 100.

As shown in FIG. 4, the substrate S is placed on the base 111 of the adjustable pin chuck 110 and variable pins 112 and is positioned thereon using the interferometer mirrors 118. At this point, a target surface $S_1$ of the substrate S faces the semi-reflective surface 135 of the optical-flat glass 133 and is substantially parallel thereto. The evacuation device 120 evacuates the recess 113 of the base 111 of the adjustable pin chuck 110 via the evacuation channel 114, such that the substrate S is attached to the base 111 and variable pins 112. The level detection device 130 then detects the horizontality of the target surface $S_1$ of the substrate S. Specifically, the light source module 131 outputs multiple parallel light beams $L_1$ to the substrate S. After a single light beam $L_1$ penetrates the beam splitter 132, one part thereof is reflected by the semi-reflective surface 135 of the optical-flat glass 133 and the other part penetrates the semi-reflective surface 135 and is reflected by the target surface $S_1$ of the substrate S. The two parts are then received by the receiver 134 via the beam splitter 132 and by reflection thereof. Accordingly, the semi-reflective surface 135 is a reference surface. The light beams $L_1$ may exhibit a phase difference due to non-parallelism between the target surface $S_1$ and the semi-reflective surface 135, thereby creating interference fringes on the receiver 134. The length control device 140 can thus determine the horizontality of the target surface $S_1$. Based upon the determination, the length control device 140 outputs a positive or negative voltage to corresponding or specific piezoelectric elements 115, forcing the piezoelectric elements 115 to lengthen or shorten. At this point, since the substrate S is attached to the base 111 and variable pins 112, the piezoelectric elements 115 of the variable pins 112 deform the substrate S (or target surface $S_1$) when lengthening or shortening. The level of the target surface $S_1$ is thus adjusted until it achieves a desirable extent.

Second Embodiment

In this embodiment, elements corresponding to similar elements in the first embodiment are given the same reference numerals.

Figure 5:
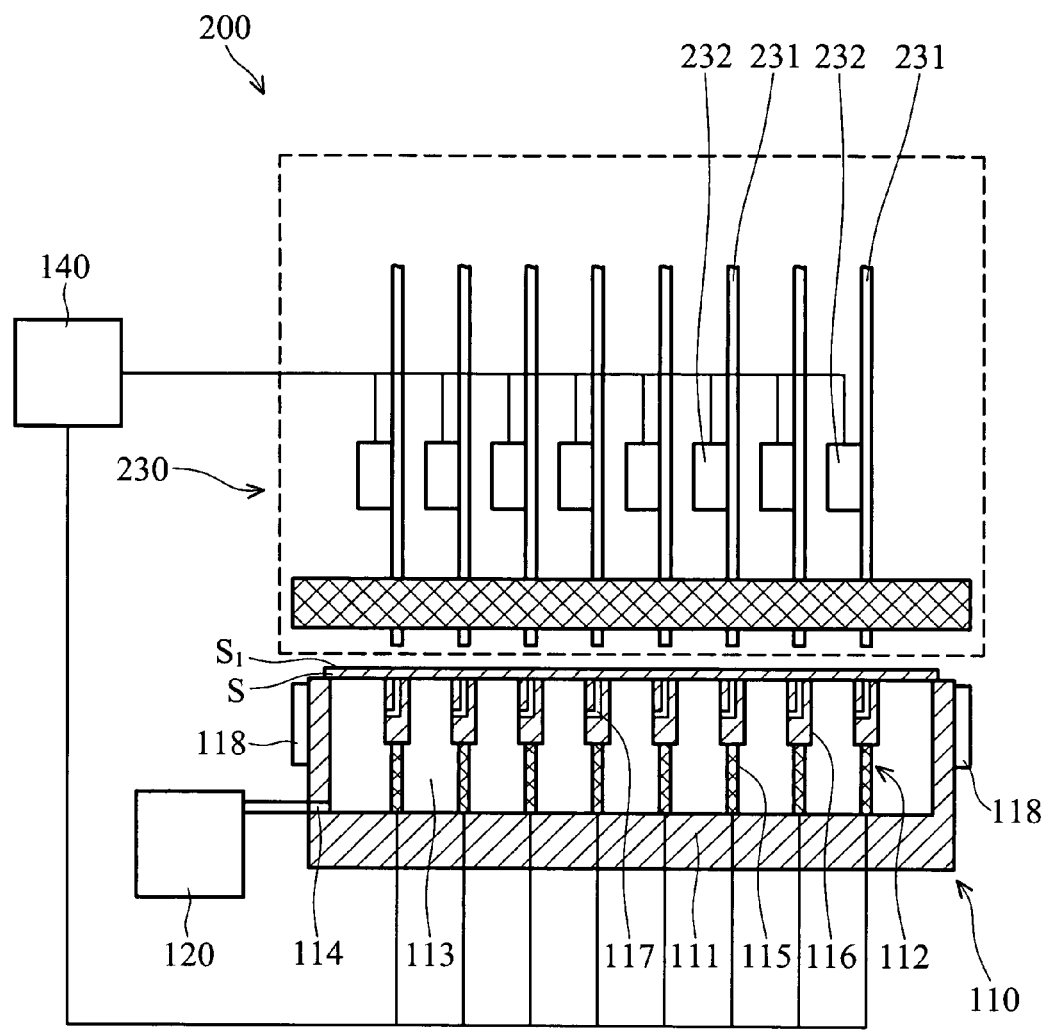
FIG. 5 is a schematic view of the level adjustment system of a second embodiment of the invention.

Referring to FIG. 5, the level adjustment system 100 of this embodiment comprises an adjustable pin chuck 110, an evacuation device 120, a level detection device 230 and a length control device 140.

As shown in FIG. 5, the level detection device 230 is disposed on the adjustable pin chuck 110. Specifically, the level detection device 230 is an air gauge comprising a plurality of air outputs 231 and a plurality of pressure sensors 232. The pressure sensors 232 are disposed on the air outputs 231 and are electrically connected to the length control device 140, respectively.

Other elements of this embodiment are similar as those of the first embodiment and explanation thereof is omitted for simplification of the description.

The following description is directed to adjustment of level of a substrate S using the level adjustment system 200.

As shown in FIG. 5, the substrate S is placed on the base 111 of the adjustable pin chuck 110 and variable pins 112 and is positioned thereon by the interferometer mirrors 118. At this point, a target surface $S_1$ of the substrate S faces the air outputs 231 and is separated therefrom. The evacuation device 120 evacuates the recess 113 of the base 111 of the adjustable pin chuck 110 via the evacuation channel 114, such that the substrate S is attached to the base 111 and variable pins 112. The level detection device 230 then detects the horizontality of the target surface $S_1$ of the substrate S. Specifically, the air outputs 231 simultaneously output air to the target surface $S_1$. Since each air output 231 is separated from the target surface $S_1$, air pressure in the air output 231 is affected due to obstruction of the target surface $S_1$. Namely, the distance between each air output 231 and the target surface $S_1$ affects the air pressure therein. Theoretically, the air pressure in each air output 231 is the same when the target surface $S_1$ is level. Accordingly, the air pressure in air outputs 231 can be detected by the corresponding pressure sensors 232 and the values thereof are transmitted to the length control device 140, thereby determining the horizontality of the target surface $S_1$. The length control device 140 can then output a positive or negative voltage to corresponding or specific piezoelectric elements 115, forcing the piezoelectric elements 115 to lengthen or shorten. At this point, since the substrate S is attached to the base 111 and variable pins 112, the piezoelectric elements 115 of the variable pins 112 deform the substrate S (or target surface $S_1$) when lengthening or shortening. The level of the target surface $S_1$ is thus adjusted until it achieves a desirable extent.

Third Embodiment

In this embodiment, elements corresponding to similar elements in the first embodiment are given the same reference numerals.

Figure 6:
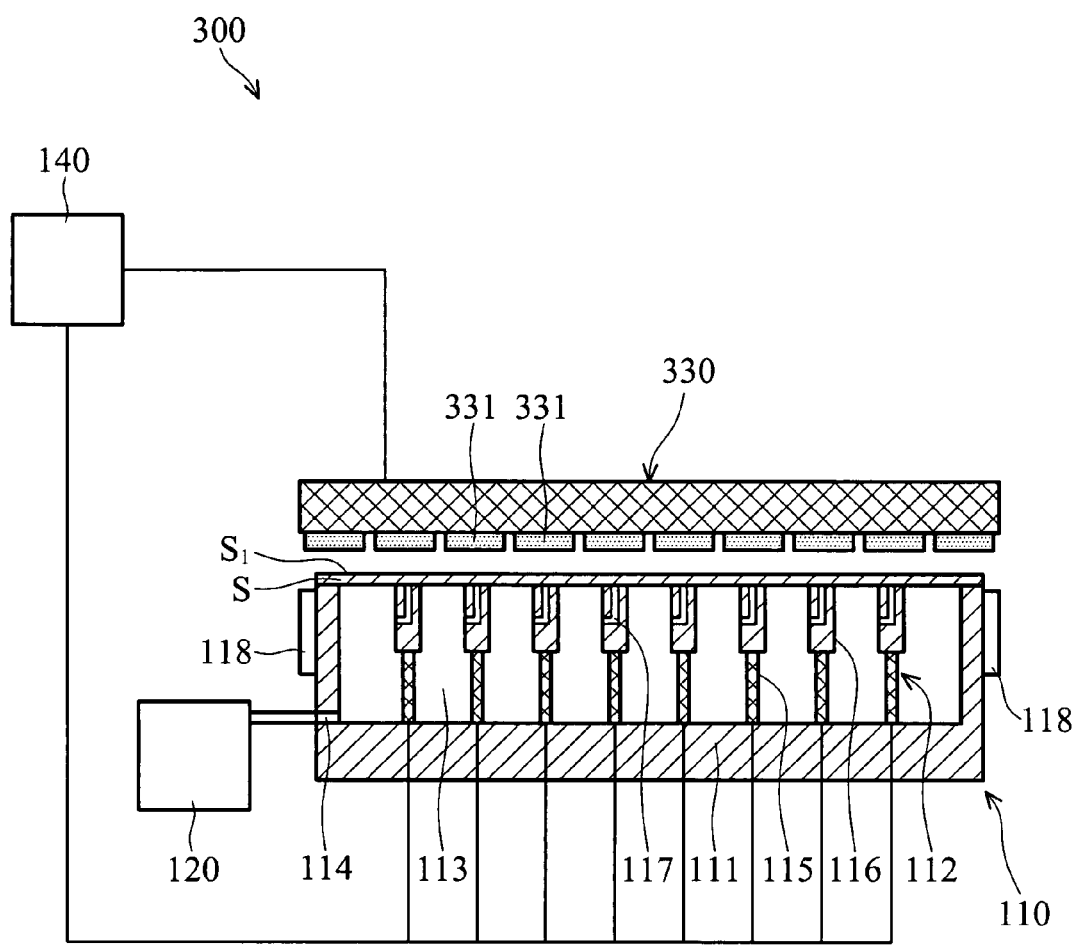
FIG. 6 is a schematic view of the level adjustment system of a third embodiment of the invention.

Referring to FIG. 6, the level adjustment system 300 of this embodiment comprises an adjustable pin chuck 110, an evacuation device 120, a level detection device 330 and a length control device 140.

As shown in FIG. 6, the level detection device 330 is disposed on the adjustable pin chuck 110. Specifically, the level detection device 330 is a capacitance gauge comprising a plurality of parallel metal plates 331 electrically connected to the length control device 140.

Other elements of this embodiment are similar as those of the first embodiment and explanation thereof is omitted for simplification of the description.

The following description is directed to adjustment of level of a substrate S using the level adjustment system 300.

As shown in FIG. 6, the substrate S is placed on the base 111 of the adjustable pin chuck 110 and variable pins 112 and is positioned thereon by the interferometer mirrors 118. At this point, a target surface $S_1$ of the substrate S faces the metal plates 331 and is separated therefrom. Additionally, the metal plates 331 are substantially parallel to the target surface $S_1$. The evacuation device 120 evacuates the recess 113 of the base 111 of the adjustable pin chuck 110 via the evacuation channel 114, such that the substrate S is attached to the base 111 and variable pins 112. The level detection device 330 then detects the horizontality of the target surface $S_1$ of the substrate S. Specifically, an alternating voltage is applied in each metal plate 331 separated from the target surface $S_1$. When the substrate S is metal, capacitance is created between the metal plate 331 and the target surface $S_1$. The value of the capacitance varies with the distance between the metal plate 331 and the target surface $S_1$. Theoretically, the smaller the distance between the metal plate 331 and the target surface $S_1$, the larger the capacitance therebetween. Accordingly, the length control device 140 can determine the horizontality of the target surface $S_1$ by reading the value of the capacitance between each metal plate 331 and the target surface $S_1$. The length control device 140 can then output a positive or negative voltage to corresponding or specific piezoelectric elements 115, forcing the piezoelectric elements 115 to lengthen or shorten. At this point, since the substrate S is attached to the base 111 and variable pins 112, the piezoelectric elements 115 of the variable pins 112 deform the substrate S (or target surface $S_1$) when lengthening or shortening. The level of the target surface $S_1$ is thus adjusted until it achieves a desirable extent.

Fourth Embodiment

In this embodiment, elements corresponding to similar elements in the first embodiment are given the same reference numerals.

Figure 7:
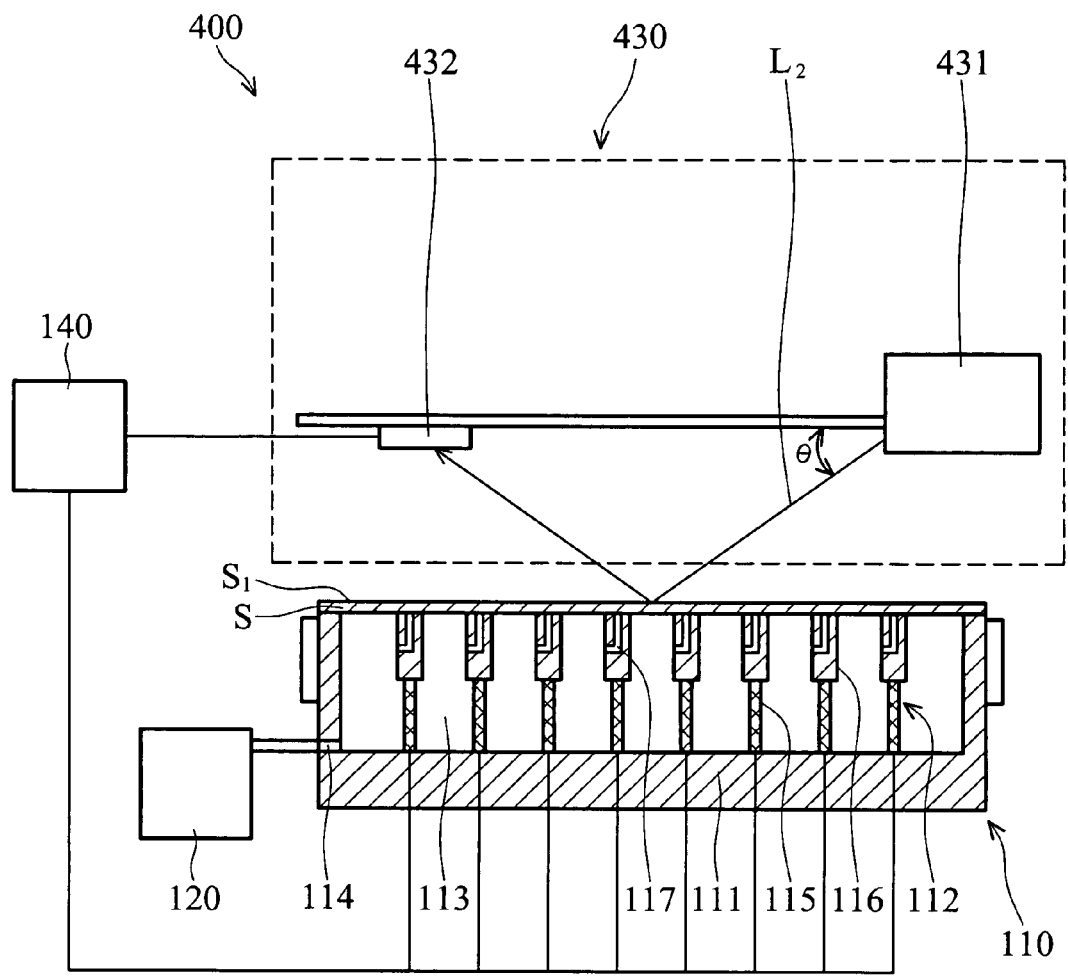
FIG. 7 is a schematic view of the level adjustment system of a fourth embodiment of the invention.

Referring to FIG. 7, the level adjustment system 400 of this embodiment comprises an adjustable pin chuck 110, an evacuation device 120, a level detection device 430 and a length control device 140.

As shown in FIG. 7, the level detection device 430 is disposed on the adjustable pin chuck 110. Specifically, the level detection device 430 comprises a light source module 431 and a light receiver 432 connected thereto at a predetermined distance. The light receiver 432 is electrically connected to the length control device 140. Specifically, the light source module 431 and light receiver 432 simultaneously move above and relative to the target surface $S_1$ of the substrate S.

Other elements of this embodiment are similar as those of the first embodiment and explanation thereof is omitted for simplification of the description.

The following description is directed to adjustment of level of a substrate S using the level adjustment system 400.

As shown in FIG. 7, the substrate S is placed on the base 111 of the adjustable pin chuck 110 and variable pins 112 and is positioned thereon by the interferometer mirrors 118. At this point, a target surface $S_1$ of the substrate S faces the light source module 431 and light receiver 432 of the level detection device 430 and is separated therefrom. The evacuation device 120 evacuates the recess 113 of the base 111 of the adjustable pin chuck 110 via the evacuation channel 114, such that the substrate S is attached to the base 111 and variable pins 112. The level detection device 430 then detects the horizontality of the target surface $S_1$ of the substrate S. Specifically, the light source module 431 outputs a light beam $L_2$ to the target surface $S_1$ at a predetermined included angle $\theta$. The light beam $L_2$ is reflected by the target surface $S_1$ and is then received by the light receiver 432. The light source module 431 continuously outputs light beams to the target surface $S_1$ when the light source module 431 and light receiver 432 move above and relative to the target surface $S_1$. The light receiver 432 receives reflected light beams from different positions on the target surface $S_1$. The length control device 140 can thus determine the horizontality of the target surface $S_1$ by means of different reflective angles of the reflected light beams. The length control device 140 can then output a positive or negative voltage to corresponding or specific piezoelectric elements 115, forcing the piezoelectric elements 115 to lengthen or shorten. At this point, since the substrate S is attached to the base 111 and variable pins 112, the piezoelectric elements 115 of the variable pins 112 deform the substrate S (or target surface $S_1$) when lengthening or shortening. The level of the target surface $S_1$ is thus adjusted until it achieves a desirable extent.

Specifically, the aforementioned level adjustment systems 100, 200, 300 and 400 are not limited to adjusting the level of the substrate S. Namely, the level adjustment systems 100, 200, 300 and 400 can also be employed to adjust curvature of the substrate S with the operation thereof is the same as that described.

Moreover, when the substrate S is a wafer, the level of which plays an important role during exposure with a step-and-repeat or step-and-scan projection printing device.

Further, the substrate S is not limited to a wafer. Namely, the substrate S may be an LCD panel and photo mask, etc.

Figure 8:
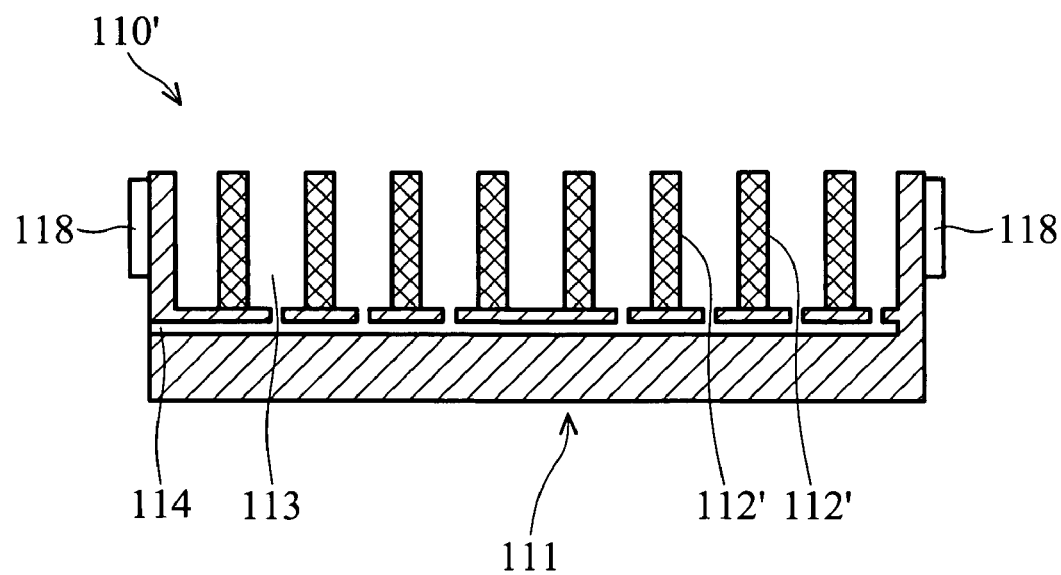
FIG. 8 is a schematic cross section of an embodiment of an adjustable pin chuck.
Figure 9A:
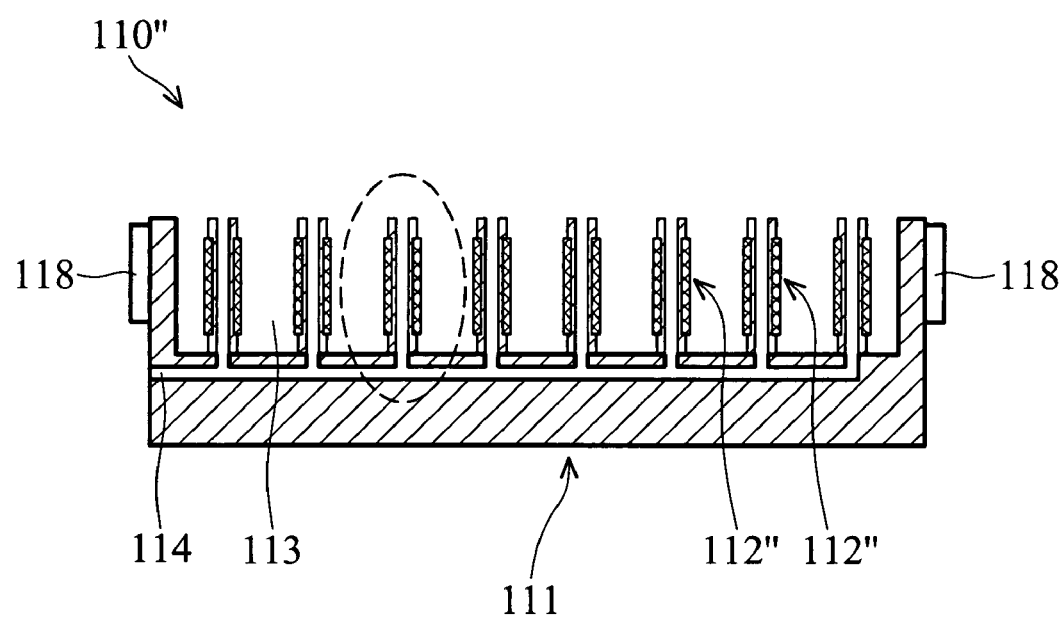
FIG. 9A is a schematic cross section of an embodiment of an adjustable pin chuck.
Figure 10:
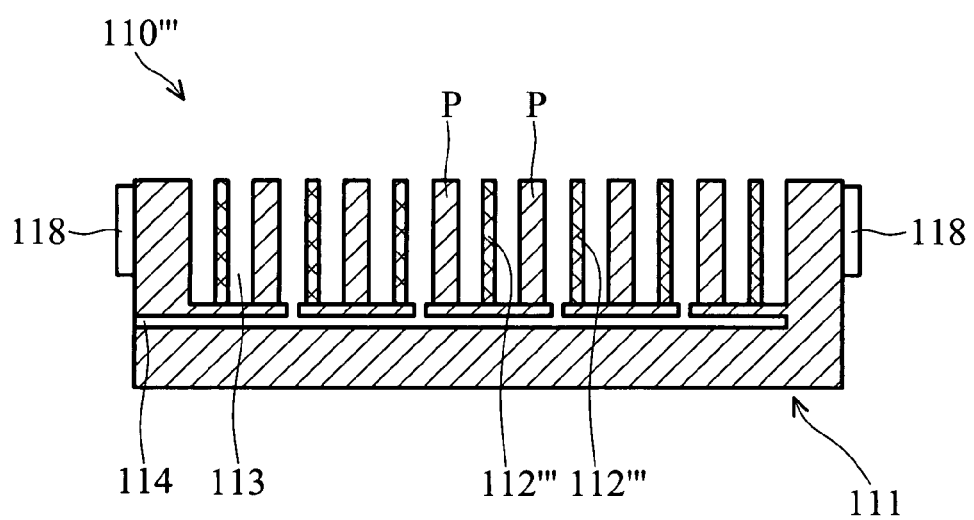
FIG. 10 is a schematic cross section of an embodiment of an adjustable pin chuck.

In addition to the adjustable pin chuck 110, embodiments of the invention also disclose an adjustable pin chuck 110' (as shown in FIG. 8), an adjustable pin chuck 110" (as shown in FIG. 9A) and an adjustable pin chuck 110''' (as shown in FIG. 10) as follows.

As shown in FIG. 8, elements corresponding to those in the adjustable pin chuck 110 are given the same reference numerals. The adjustable pin chuck 110' comprises a base 111 and a plurality of variable pins 112'. The base 111 comprises a recess 113 and an evacuation channel 114 connected thereto. The variable pins 112' are uniformly disposed in the recess 113. Specifically, the variable pins 112' are composed of a piezoelectric material and are disposed on the base 111. Additionally, two interferometer mirrors 118 are disposed on two sides of the base 111 of the adjustable pin chuck 110', respectively.

Accordingly, the adjustable pin chuck 110' can replace the adjustable pin chuck 110 in the aforementioned level adjustment systems 100, 200, 300 and 400, with the variable pins 112' thereof directly electrically connected to the length control device 140.

Figure 9B:
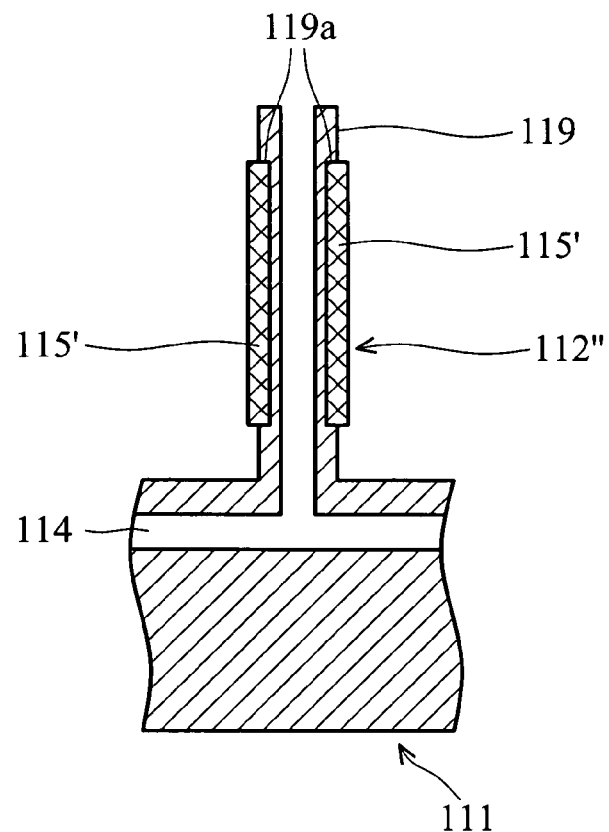
FIG. 9B is a partial enlarged view according to FIG. 9A.

As shown in FIG. 9A, elements corresponding to those in the adjustable pin chuck 110 are given the same reference numerals. The adjustable pin chuck 110" comprises a base 111 and a plurality of variable pins 112". The base 111 comprises a recess 113 and an evacuation channel 114 connected thereto. The variable pins 112" are uniformly disposed in the recess 113. Specifically, as shown in FIG. 9B, each variable pin 112" comprises a hollow column 119 and a piezoelectric element 115'. The hollow column 119 is connected to the evacuation channel 114 and is disposed on the base 111. Specifically, the outer wall of the hollow column 119 is formed with an annular groove 119a and the piezoelectric element 115' is disposed therein. Additionally, as shown in FIG. 9A, two interferometer mirrors 118 are disposed on two sides of the base 111 of the adjustable pin chuck 110", respectively.

Accordingly, the adjustable pin chuck 110" can replace the adjustable pin chuck 110 in the aforementioned level adjustment systems 100, 200, 300 and 400, and the piezoelectric elements 115' of the variable pins 112" thereof are electrically connected to the length control device 140.

As shown in FIG. 10, elements corresponding to those in the adjustable pin chuck 110 are given the same reference numerals. The adjustable pin chuck 110''' comprises a base 111, a plurality of variable pins 112''' and a plurality of fixed pins P. The base 111 comprises a recess 113 and an evacuation channel 114 connected thereto. The variable pins 112''' and fixed pins P are alternately disposed in the recess 113 and on the base 111. Specifically, the variable pins 112''' are composed of a piezoelectric material. Additionally, two interferometer mirrors 118 are disposed on two sides of the base 111 of the adjustable pin chuck 110''', respectively.

Accordingly, the adjustable pin chuck 110''' can replace the adjustable pin chuck 110 in the aforementioned level adjustment systems 100, 200, 300 and 400, with the variable pins 112''' thereof directly electrically connected to the length control device 140.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level adjustment system, comprising:
   an adjustable pin chuck, with a base and at least one variable pin, wherein the base comprises an evacuation channel, the variable pin comprises a hollow column and a piezoelectric element, the hollow column is connected to the evacuation channel, the outer wall of the hollow column is formed with an annular groove, and the piezoelectric element is disposed in the annular groove;
   a level detection device disposed on the adjustable pin chuck; and
   a length control device electrically connected to the level detection device and the piezoelectric element of the variable pin, wherein the length control device changes the length of the variable pin.

2. The level adjustment system as claimed in claim 1, wherein the level detection device further comprises a light source module, a beam splitter, an optical-flat glass and a receiver, the light source module is disposed on the beam splitter, the beam splitter is disposed on the optical-flat glass, and the receiver is disposed on one side of the beam splitter and is electrically connected to the length control device.

3. The level adjustment system as claimed in claim 2, wherein the optical-flat glass further comprises a semi-reflective surface.

4. The level adjustment system as claimed in claim 2, wherein the receiver comprises a COD sensor.

5. The level adjustment system as claimed in claim 1, wherein the level detection device comprises an air gauge.

6. The level adjustment system as claimed in claim 5, wherein the air gauge further comprises at least one air output and at least one pressure sensor, and the pressure sensor is disposed on the air-output and is electrically connected to the length control device.

7. The level adjustment system as claimed in claim 1, wherein the level detection device comprises a capacitance gauge.

8. The level adjustment system as claimed in claim 7, wherein the capacitance gauge further comprises at least one metal plate.

9. The level adjustment system as claimed in claim 1, wherein the level detection device further comprises a light source module and a light receiver connected thereto at a predetermined distance, the light receiver is electrically connected to the length control device.

10. The level adjustment system as claimed in claim 1, wherein the variable pin comprises a piezoelectric material.

11. The level adjustment system as claimed in claim 1, wherein the base comprises a recess connected to the evacuation channel, and the variable pin is disposed in the recess.

12. The level adjustment system as claimed in claim 11, further comprising an evacuation device connected to the evacuation channel of the base to evacuate the recess.

13. An adjustable pin chuck, comprising:
   a base, with a recess and an evacuation channel connected thereto; and at least one variable pin disposed in the recess and comprising a hollow column and a piezoelectric element, wherein the base and variable pin support a substrate, the hollow column is connected to the evacuation channel and supports the substrate, the outer wall of the hollow column is formed with an annular groove to receive the piezoelectric element, and the variable pin lengthens and shortens to adjust level of the substrate.

14. The adjustable pin chuck as claimed in claim 13, wherein the variable pin comprises a piezoelectric material.

* * * * *